United States Patent [19]
Jinbo

[11] Patent Number: 5,301,149
[45] Date of Patent: Apr. 5, 1994

[54] DATA READ-OUT CIRCUIT FOR SEMICONDUCTOR MEMORY DEVICE

[75] Inventor: Toshikatsu Jinbo, Tokyo, Japan

[73] Assignee: NEC Corporation, Tokyo, Japan

[21] Appl. No.: 871,102

[22] Filed: Apr. 20, 1992

[30] Foreign Application Priority Data

Apr. 19, 1991 [JP] Japan ................................ 3-115560

[51] Int. Cl.$^5$ ............................................. G11C 11/40
[52] U.S. Cl. ................... 365/185; 365/189.09; 365/210; 365/208
[58] Field of Search .................. 365/189.09, 185, 207, 365/208, 210; 307/530

[56]  References Cited
U.S. PATENT DOCUMENTS

| 4,799,195 | 1/1989 | Iwahashi et al. | 365/185 |
| 4,802,138 | 1/1989 | Shimamune | 365/210 |
| 4,916,665 | 4/1990 | Atsumi et al. | 365/185 |

Primary Examiner—Joseph A. Popek
Attorney, Agent, or Firm—Sughrue, Mion, Zinn, Mcpeak & Seas

[57] ABSTRACT

A data read-out circuit in the semiconductor memory device has a sense circuit which detects the state of a selected memory cell and outputs a sense output voltage, a reference voltage generating circuit which outputs a reference voltage, and a comparison amplifier which compares the sense output voltage with the reference voltage and outputs an output voltage. The data read-out circuit further has a reference voltage control circuit consisting of a P-channel MOSFET connected between a power supply source and an output node of the reference voltage generating circuit. A gate of the P-channel MOSFET receives the sense output voltage from the sense circuit. When the sense output voltage is a low level, the P-channel MOSFET becomes conductive and the reference output voltage is changed to a high level substantially equal to the power supply voltage and, when the sense output voltage is a high level, the P-channel MOSFET becomes non-conductive and the reference output voltage is changed to a low level substantially equal to the ground potential. Therefore, the data read-out circuit has a wide operation margin and operates in low power consumption.

7 Claims, 7 Drawing Sheets

DATA READ-OUT CIRCUIT FOR SEMICONDUCTOR MEMORY DEVICE

BACKGROUND OF THE INVENTION (1) Field of the Invention

The present invention relates to a semiconductor memory device and, more particularly, to a data read-out circuit which has a wide operation margin and operates with low power consumption.

(2) Description of the Related Art

As a non-volatile semiconductor memory device, there has been known a semiconductor memory device using as a memory cell a MOS field effect transistor (hereinafter referred to as "MOSFET") which has a two-layered gate-structure, for example, a floating gate and a control (regular) gate. FIG. 1 is a cross-sectional view showing such a kind of memory cell, and FIG. 2 is a symbolic diagram of such memory cell. The memory cell shown in FIG. 1 has N-type source/drain diffusion layers 72 and 73 on its P-type semiconductor substrate 71, and also has a floating gate 74 which is electrically insulated from outside by an insulating layer (not shown) provided on the substrate 71, and a control gate 75 for controlling the switching operation of the memory cell.

This memory cell becomes conductive with a low control voltage (e.g. 2 V), as shown with a solid line 91 in FIG. 3, when the floating gate 74 is electrically in a neutral state (hereinafter referred to as "non-written state"), but a threshold voltage of the memory cell seen from the control gate 75 becomes high (hereinafter referred to as "written state") as electrons are injected to the floating gate 74 when a high voltage (e.g. 12.5 V) is applied to the control gate 75 and the drain 73 and electrons are injected to the floating gate 74. Thus, as shown with a solid line 92 in FIG. 3, the memory cell does not become conductive unless a high voltage (e.g. 7 V) is applied to the control gate 75 of the memory cell. Data can be stored with the utilization of this change in the threshold voltage.

FIG. 4 is a circuit diagram showing a data read-out circuit in a conventional non-volatile semiconductor memory device which uses the above mentioned memory cells. The conventional non-volatile semiconductor memory device has a memory cell array MA5 including a plurality of memory cells MC11~MCmn in a matrix form therein whose drains are connected to a plurality of column lines D1~Dn and whose gates are connected to a plurality of row lines SX1~SXm functioning as common gate electrodes. The row lines SX1~SXm selectively control the memory cells by the row selection signals from a row decoder XD5.

The column lines D1~Dn are connected to an input node SIN5 of a sense circuit SA5 through a column selection circuit YS5 which is formed by N-channel MOSFETs MY1~MYn, and these N-channel MOSFETs MY1~MYn are selectively on-off controlled by column selection signals SY1~SYn from a column decoder YD5.

In the sense circuit SA5, the input node SIN5 is connected to a source of an N-channel MOSFET MN51 and also to an input terminal of an inverter circuit INV51, and an output terminal of the inverter circuit INV51 is connected to a gate of this N-channel MOSFET MN51. The source of a P-channel MOSFET MP51 which operates as a load MOSFET is connected to a power supply source Vc, and the gate and drain thereof are commonly connected to the drain of the N-channel MOSFET MN51. An output node $V_{SA5}$ of this sense circuit SA5 is defined between the drain of the N-channel MOSFET MN51 and the common gate/drain of the P-channel MOSFET MP51.

A reference voltage generation circuit RA5 which is formed by an N-channel MOSFET MN52, an inverter circuit INV52 and a P-channel MOSFET MP52 has an identical circuit configuration as that of the above described sense circuit SA5. An input node of this reference voltage generation circuit RA5 is connected, through an N-channel MOSFET MYR5 which is equivalent to each of the N-channel MOSFETs MY1~MYn constituting the column selection circuit YS5, to a reference memory cell MCR5 which is equivalent to each of the memory cells MC11~MCmn. The reference voltage generation circuit RA5 outputs a reference voltage $V_{RA5}$.

A comparison amplifier AMP5 is formed by one series circuit of a P-channel MOSFET MP53 and an N-channel MOSFET MN53 and the other series circuit of a P-channel MOSFET MP54 and an N-channel MOSFET MN54, each of the series circuits being connected between the power supply source Vc and the ground potential source Vs. The gate of the N-channel MOSFET MN53 is connected to the gate and the drain of the N-channel MOSFET MN54, thereby constituting a current-mirror circuit. The sense output $V_{SA5}$ from the sense circuit SA5 is supplied to the gate of the P-channel MOSFET MP53, and the reference output $V_{RA5}$ from the reference voltage generation circuit RA5 is supplied to the gate of the P-channel MOSFET MP54. The junction node between the drain of the P-channel MOSFET MP53 and the drain of the N-channel MOSFET MN53 is connected to an output terminal DAT5.

Next, an operation of the above described data read-out circuit is explained. For instance, when the memory cell MC11 in the memory cell array MA5 is to be selected, the row line SX1 is selected by the row decoder XD5, and the column line D1 is selected through the N-channel MOSFET MY1 by the column decoder YD5. As a result, the memory cell MC11, which is located at the intersection of the selected row line SX1 and the column line D1, is connected to the input node SIN5.

When this selected memory cell MC11 is in its non-written state, the column line D1 and the input node SIN5 of the sense circuit SA5 are discharged through the memory cell MC11, so that the potential at the input node SIN5 becomes low. Consequently, the output of inverter circuit INV51 turns to a high voltage and the N-channel MOSFET MN51 becomes conductive accordingly. As a result, the potential of the output $V_{SA5}$ of the sense circuit SA5 turns to a lower level, too.

To the contrary, when the selected memory cell MC11 is in the written state, the column line D1 and the input node SIN5 of the sense circuit SA5 are changed through the P-channel MOSFET MP51 and the N-channel MOSFET MN51, so that the potential at the input node SIN5 of the sense circuit SA5 becomes high. Consequently, the output of the inverter circuit INV51 becomes a low level, thereby causing the N-channel MOSFET MN51 to become a non-conductive state, and accordingly the output $V_{SA5}$ of the sense circuit SA5 turns to a high level by the P-channel MOSFET MP51.

The reference voltage generation circuit RA5 outputs an output $V_{RA5}$ of low level because the connected reference memory cell MCR5 is in the non-written state and its gate electrode is connected to the power supply source Vc and is in its conductive state.

The sense output $V_{SA5}$ from the sense circuit SA5, which changes according to the state of the selected memory cell among the cells MC11~MCmn, is compared with the potential of the reference output $V_{RA5}$ of the reference voltage generation circuit RA5 by the comparison amplifier AMP5, whereby the output data DAT5 is obtained.

In the actual products of the semiconductor memory devices, the desired characteristics are realized by so designing that the characteristics of each of the memory cells MC11~MCmn in the non-written state and the characteristics of the reference memory cell MCR5 are identical, that the characteristics of the elements constituting the sense circuit SA5 and the characteristics of the elements constituting the reference voltage generation circuit RA5 are identical, that the characteristics of the P-channel MOSFETs MP53, MP54 in the comparison amplifier AMP5 are identical, and that the mutual transfer conductance of the N-channel MOSFETs MN53, MN54 constituting the current-mirror circuit are appropriately set.

For example, assuming that the respective mutual transfer conductance of the N-channel MOSFETs MN53, MN54 are $gm_{(MN53)}$, $gm_{(MN54)}$, respectively, the $gm_{(MN54)}$ is designed one half the $gm_{(MN53)}$.

The characteristics of the comparison amplifier AMP5 having the above conditions are shown in FIG. 5. In FIG. 5, the abscissa is the output voltage $V_{DAT5}$ at the output terminal DAT5 of the comparison amplifier AMP5 and the ordinate is the current. Here, the current flowing in the N-channel MOSFET MN53 is shown by $I_{MN53}$, the current flowing in the P-channel MOSFET MP53, in the case where the selected memory cell is in the non-written state, is shown by $I_{MP53A}$, and the same, in the case where the selected memory cell is in the written state, is shown by $I_{MP53B}$ (normally 0 A). Thus, by making the mutual transfer conductance $gm_{(MN54)}$ one half the mutual transfer conductance $gm_{(MN53)}$, the current $I_{MN53}$ takes an intermediate level between the current $I_{MP53A}$ and $I_{MP53B}$, and when the selected memory cell is in the non-written state, the output voltage $V_{DAT5}$ at the output terminal DAT5 is V51 which is the intersection of the current $I_{MN53}$ and $I_{MP53A}$, and when the selected memory cell is in the written state, the output voltage $V_{DAT5}$ is the ground potential voltage Vs which is the intersection of the current $I_{MN53}$ and $I_{MP53B}$.

In the data read-out circuit in the conventional semiconductor memory device having the above explained circuit configuration, the output voltage $V_{RA5}$ from the reference voltage generation circuit RA5 is constant, and therefore, the current which flows, according to the output voltage $V_{RA5}$, in the N-channel MOSFET MN53 of the comparison amplifier AMP5 takes an intermediate level, as shown by $I_{MN53}$ in FIG. 5, between the current $I_{MP53A}$ which flows in the P-channel MOSFET MP53 when the selected memory cell is in the non-written state and the current $I_{MP53B}$ which flows in the same P-channel MOSFET MP53 when the selected memory cell is in the written state. As a result, the high level output obtained at the output terminal DAT5 goes up only to the voltage V52 which is lower than the power supply voltage Vc and, in the case where the output $V_{DAT5}$ is to be turned to a high level, the capacitance parasitic to the output terminal DAT5 has to be charged by the current of $I_{MP53A}-I_{MN53}$. When the output voltage $V_{DAT5}$ is to be turned to a low level, the charge in the capacitance parasitic to the output terminal DAT5 has to be discharged by the current of $I_{MN53}-I_{MP53B}$, but when the output voltage $V_{DAT5}$ is to be turned to a high level, the through-current flows from the power supply source Vc to the ground potential source Vs through the P-channel MOSFET MP53 and the N-channel MOSFET MN53, thereby increasing the consumption of current. Further, in order to make the speed of charging and discharging of the output terminal DAT5 higher, it is necessary to set the currents $I_{MP53A}$ and $I_{MN53}$ larger, which also presents a problem of increasing the current. These are problems to be solved in the conventional data read-out circuit.

SUMMARY OF THE INVENTION

It is, therefore, an object of the invention to overcome the problems existing in the conventional circuits and to provide an improved data read-out circuit which has a wide operation margin and which operates in low power consumption.

According to one aspect of the invention, there is provided a semiconductor memory device comprising:

a power supply node and a ground potential node;

a plurality of memory cells arranged in a matrix form;

an address means for selecting one particular memory cell among the plurality of memory cells which is designated by an address information;

a sense circuit for outputting a sense output voltage corresponding to a logic level of data which has been read-out from the particular memory cell selected by the address means;

a reference voltage generation circuit for producing a reference voltage;

a comparison amplifier of a current-mirror type which compares the sense output voltage from the sense circuit with the reference voltage from the reference voltage generation circuit; and a reference voltage control means for varying the reference voltage from the reference voltage generation circuit in accordance with the changes in the sense output voltage from the sense circuit.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be explained with reference to the accompanying drawings.

Figure 6:
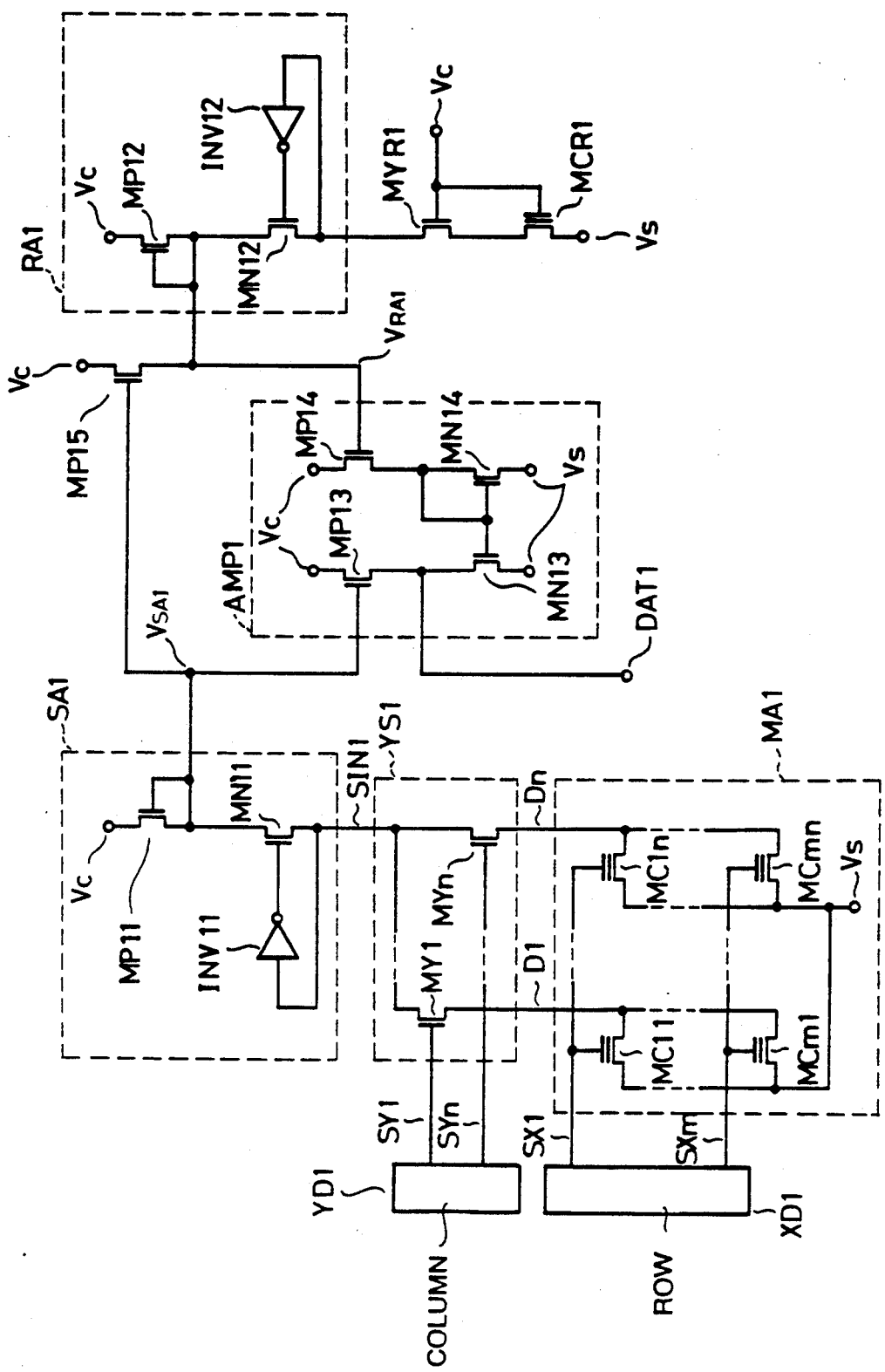
FIG. 6 is a circuit diagram of a data read-out circuit of a first embodiment according to the invention.

FIG. 6 is a circuit diagram of a semiconductor memory device of a first embodiment according to the present invention.

A memory cell array MA1 has a plurality of memory cells MC11~MCmn whose drains are connected to a plurality of column lines D1~Dn and whose gates are connected to a plurality of row lines SX1~SXm functioning as a plurality of common gate electrodes. The row lines SX1~SXm selectively control the memory cells MC11~MCmn in accordance with the row selection signals from a row decoder XD1.

The column lines D1~Dn are connected to the input node SIN1 of a sense circuit SA1 through a column selection circuit YS1 which is formed by a plurality of N-channel MOSFETs MY1~MYn. The N-channel MOSFETs MY1~MYn are controlled selectively by the column selection signals SY1~SYn from a column decoder YD1.

The sense circuit SA1 is formed by an N-channel MOSFET MN11, an inverter circuit INV11 and a P-channel MOSFET MP11. The input node SIN1 of the sense circuit SA1 is connected to the source of the N-channel MOSFET MN11 and the input terminal of the inverter circuit INV11. The output terminal of the inverter circuit INV11 is connected to the gate of the N-channel MOSFET MN11. The P-channel MOSFET MP11 functioning as an active load has a source connected to the power supply source Vc, and a gate and a drain connected together and further connected to the drain of the N-channel MOSFET MN11. An output voltage $V_{SA1}$ of the sense circuit SA1 is outputted from a junction node between the drain of the N-channel MOSFET MN11 and the tied gate and drain of the P-channel MOSFET MP11.

A reference voltage generation circuit RA1 formed by an N-channel MOSFET MN12, an inverter circuit INV12 and a P-channel MOSFET MP12 has the same circuit configuration as that of the sense circuit SA1. An input node of this reference voltage generation circuit RA1 is connected, through an N-channel MOSFET MYR1 which is equivalent to each of the N-channel MOSFETs MY1~MYn constituting the column selection circuit YS1, to a reference memory cell MCR1 which is equivalent to each of the memory cells MC11~MCmn in the memory cell array MA1. A reference voltage $V_{RA1}$ is produced by this reference voltage generation circuit RA1.

A comparison amplifier AMP1 has one series circuit of a P-channel MOSFET MP13 and an N-channel MOSFET MN13 and the other series circuit of a P-channel MOSFET MP14 and an N-channel MOSFET MN14, each series circuit being connected between the power supply source Vc and the ground potential source Vs. The gate of the N-channel MOSFET MN13 is connected commonly to the gate and drain of the N-channel MOSFET MN14, thereby forming a current-mirror circuit. The output $V_{SA1}$ is supplied to the gate of the P-channel MOSFET MP13 and the output $V_{RA1}$ of the reference voltage generation circuit RA1 is supplied to the gate of the P-channel MOSFET MP14. A common junction node of the drain of the P-channel MOSFET MP13 and the drain of the N-channel MOSFET MN13 is connected to an output terminal DAT1.

As a reference voltage control means, there is provided a P-channel MOSFET MP15 between the power supply source Vc and the output node $V_{RA1}$ of the reference voltage generation circuit RA1. The P-channel MOSFET MP15 has a gate connected to the output node $V_{SA1}$ of the sense circuit SA1.

Next, the operation of the above first embodiment will be explained with reference to the voltage-current characteristic curves shown in FIGS. 7A and 7B.

Figure 1:
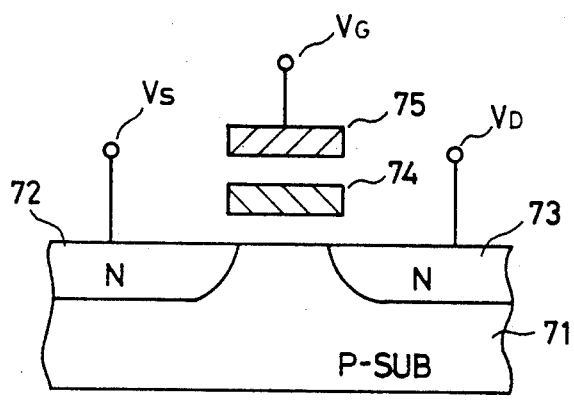
FIG. 1 is a sectional view showing a memory cell having a two-layered gate-structure.
Figure 2:
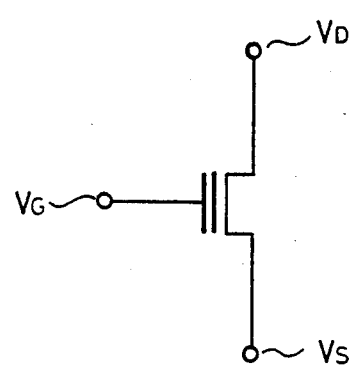
FIG. 2 is a symbolic diagram of the memory cell.
Figure 3:
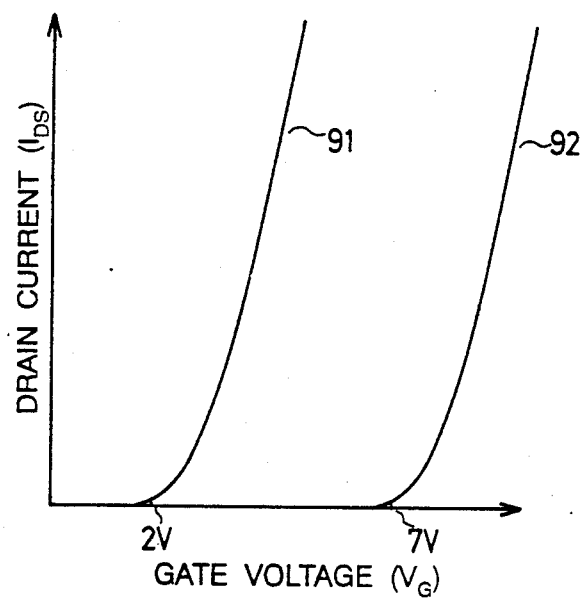
FIG. 3 is a graph showing characteristic curves of the memory cell shown in FIG. 1.
Figure 4:
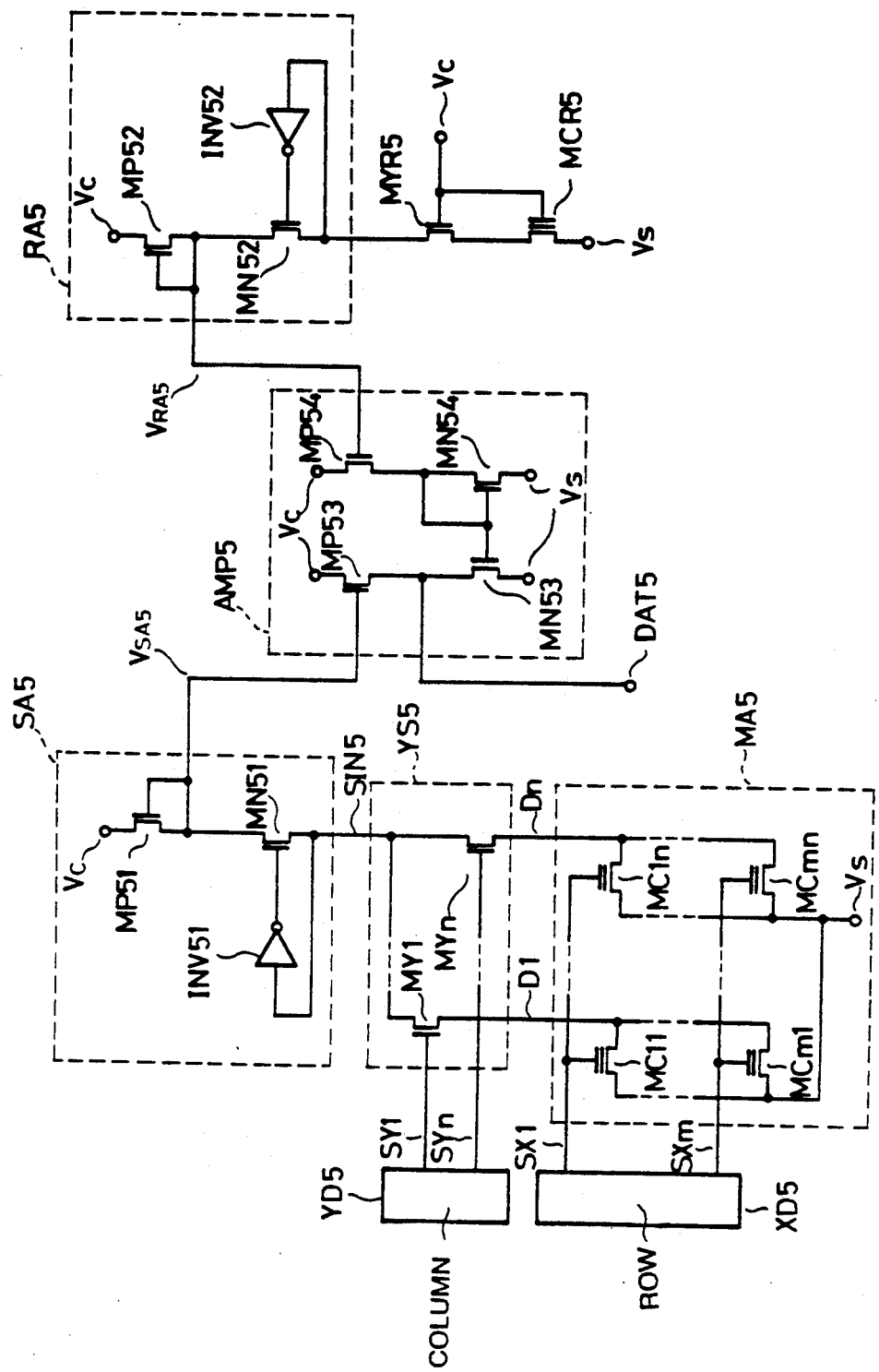
FIG. 4 is a circuit diagram of a typical conventional data read-out circuit.
Figure 5:
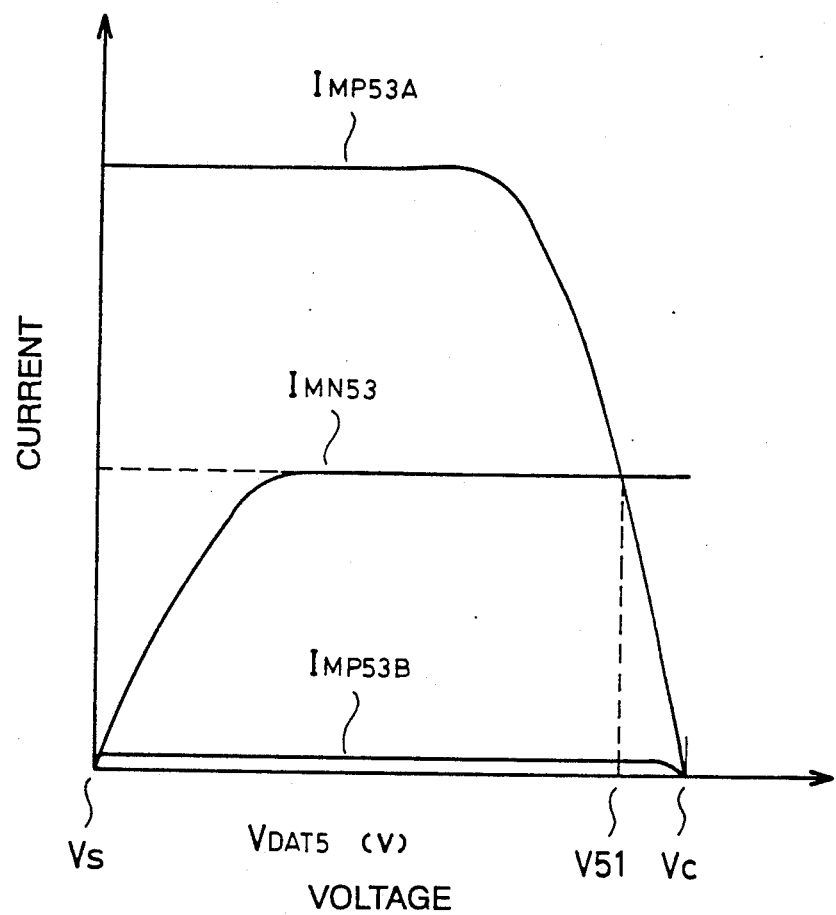
FIG. 5 is a graph showing the voltage-current characteristic curves in the conventional circuit.
Figure 7A:
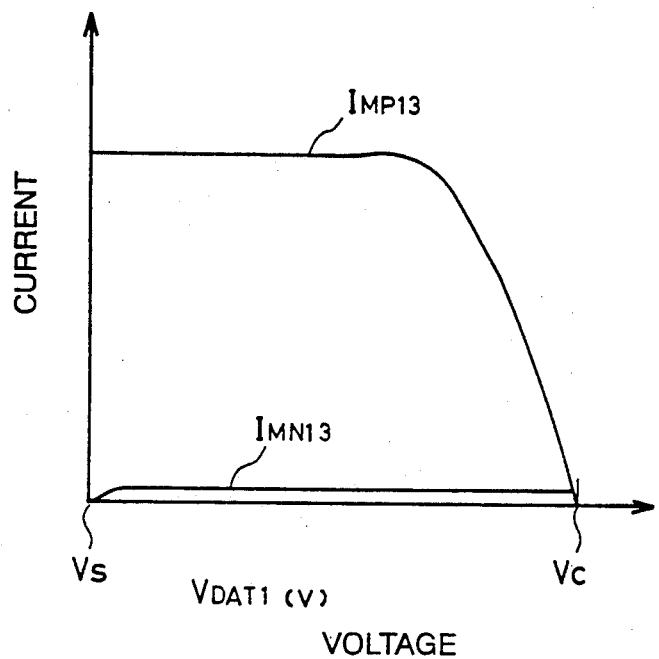
FIGS. 7A and 7B are graphs showing the voltage-current characteristic curves in the first embodiment shown in FIG. 6.

In the case where the selected memory cell (any one of the memory cells MC11~MCmn) is in the non-written state, the operation is the same as that of the conventional data read-out circuit shown in FIG. 4, that is, the sense circuit SA1 outputs an output $V_{SA1}$ of low level and a current $I_{MP13}$ shown in FIG. 7A flows in the P-channel MOSFET MP13. At this time, as the P-channel MOSFET MP15 receives at its gate the output voltage $V_{SA1}$ of low level, it becomes conductive and it pulls up the output voltage $V_{RA1}$ of the reference voltage generation circuit RA1 to the high level.

With the high level of the reference output $V_{RA1}$ of the reference voltage generation circuit RA1, the P-channel MOSFET MP14 becomes a non-conductive state or a high resistance state and thus substantially no current flows therein. As a consequence, substantially no current flows either in the N-channel MOSFET MN14 which is connected in series to the P-channel MOSFET MN14, and also in the N-channel MOSFET MN13 which constitutes the current-mirror circuit with the N-channel MOSFET MN14. Accordingly, the current flowing in the N-channel MOSFET MN13 assumes the current $I_{MN13}$ shown in FIG. 7A.

Under the above circumstance, the output DAT1 of the comparison amplifier AMP1 becomes substantially the same voltage as the power supply voltage Vc, which is the intersection of the current $I_{MP13}$ and $I_{MN13}$ in FIG. 7A.

Figure 7B:
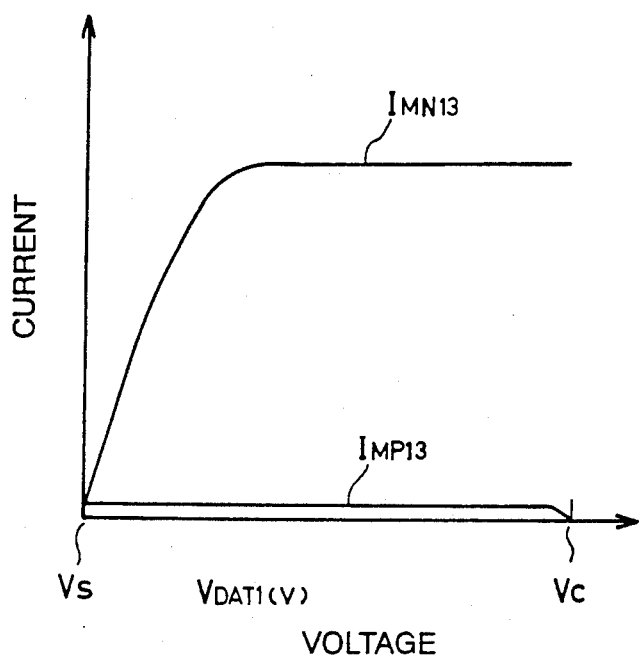

On the contrary, in the case where the selected memory cell is in the written state, in the same manner as the conventional circuit shown in FIG. 4, the sense circuit SA1 outputs the sense output $V_{SA1}$ of high level and substantially no current flows in the P-channel MOSFET MP13 as shown by $I_{MP13}$ in FIG. 7B.

In this case, as the P-channel MOSFET MP15 receives at its gate the output $V_{SA1}$ of high level, it becomes nonconductive and the output $V_{RA1}$ of the reference voltage generation circuit RA1 is low level in the same way as the conventional circuit shown in FIG. 4.

With the low level of the output $V_{RA1}$ of the reference voltage generation circuit RA1, the P-channel MOSFET MP14 becomes conductive and, accordingly, the N-channel MOSFET MN14 connected in series to the P-channel MOSFET MP14, and the N-channel MOSFET MN13 constituting the current-mirror circuit with the N-channel MOSFET MN14 become conductive. Accordingly, the current flowing in the N-channel MOSFET MN13 assumes the current $I_{MN13}$ shown in FIG. 7B.

Under the above circumstance, the output DAT1 of the comparison amplifier AMP1 becomes substantially the same voltage as the ground potential voltage Vs, which is the intersection of the current $I_{MP13}$ and $I_{MN13}$ in FIG. 7B.

Figure 8:
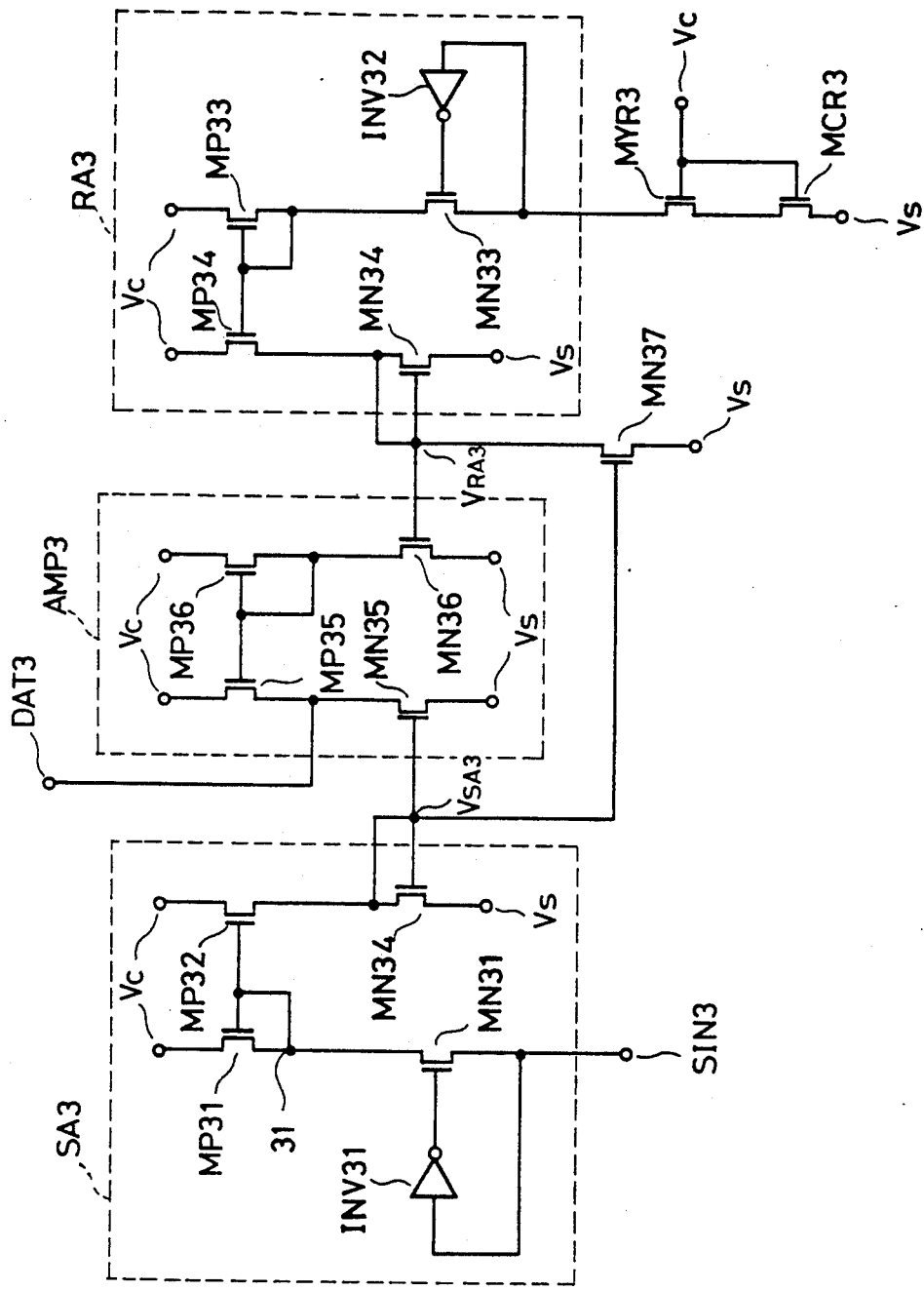
FIG. 8 is a circuit diagram of a data read-out circuit of a second embodiment according to the invention.

Next, FIG. 8 is a circuit diagram of a second embodiment according to the invention. The sense circuit SA3 has an N-channel MOSFET MN31, an inverter circuit INV31 and a P-channel MOSFET MP31. An input node SIN3 of the sense circuit SA3 is connected to the source of the N-channel MOSFET MN31 and the input terminal of the inverter circuit INV31. The output terminal of the inverter circuit INV31 is connected to the gate of the N-channel MOSFET MN31. The P-channel MOSFET MP31 has a source connected to the power supply source Vc, and a gate and a drain tied together and further connected to the drain of the N-channel MOSFET MN31. The sense circuit SA3 further has a series circuit of a P-channel MOSFET MP32 and an N-channel MOSFET MN32 connected between the power supply source Vc and the ground potential source Vs. The P-channel MOSFET MP32 has a source connected to the power supply source Vc, a gate connected to the tied gate and drain of the P-channel MOSFET MP31. The P-channel MOSFETs MP31 and MP32 form a current-mirror circuit. The N-channel MOSFET MN32 has a source connected to the ground potential source Vs, a gate and a drain tied together and further connected to the drain of the P-channel MOSFET MP32. The junction node of the drain of the P-channel MOSFET MP32 and the drain and the gate of the N-channel MOSFET MN32 forms an output terminal $V_{SA3}$ of the sense circuit SA3.

The input node SIN3 of the sense circuit SA3 is connected to the column lines through a column selection circuit (not shown in FIG. 6) in the same manner as the above explained first embodiment.

A reference voltage generation circuit RA3 formed by N-channel MOSFETs MN33, MN34, P-channel MOSFETS MP33, MP34, and an inverter circuit INV32 has the same circuit configuration as that of the sense circuit SA3. An input node of the reference voltage generation circuit RA3 is connected to a reference memory cell MCR3 which is equivalent to the memory cell through an N-channel MOSFET MYR3 which is equivalent to each of the MOSFETs which constitute the column selection circuit. The reference voltage generation circuit RA3 outputs an reference voltage $V_{RA3}$.

A comparison amplifier AMP3 has one series circuit of a P-channel MOSFET MP35 and an N-channel MOSFET MN35, and the other series circuit of a P-channel MOSFET MP36 and an N-channel MOSFET MN36, each series circuit being connected between the power supply source Vc and the ground potential source Vs. The gate of the P-channel MOSFET MP35 is commonly connected to the gate and the drain of the P-channel MOSFET MP36, thereby forming a current-mirror circuit. The output voltage $V_{SA3}$ of the sense circuit SA3 is applied to the gate of the N-channel MOSFET MN35. The reference voltage $V_{RA3}$ of the reference voltage generation circuit RA3 is applied to the gate of the N-channel MOSFET MN36. A common junction node of the drain of the P-channel MOSFET MP35 and the drain of the N-channel MOSFET MN35 is connected to an output terminal DAT3.

As a reference voltage control means, the data readout circuit of this embodiment has an N-channel MOSFET MN37 connected between the ground potential source Vs and the output terminal $V_{RA3}$ of the reference voltage generation circuit RA3. The N-channel MOSFET MN37 receives at its gate the output voltage $V_{SA3}$ of the sense circuit SA3.

Figure 9A:
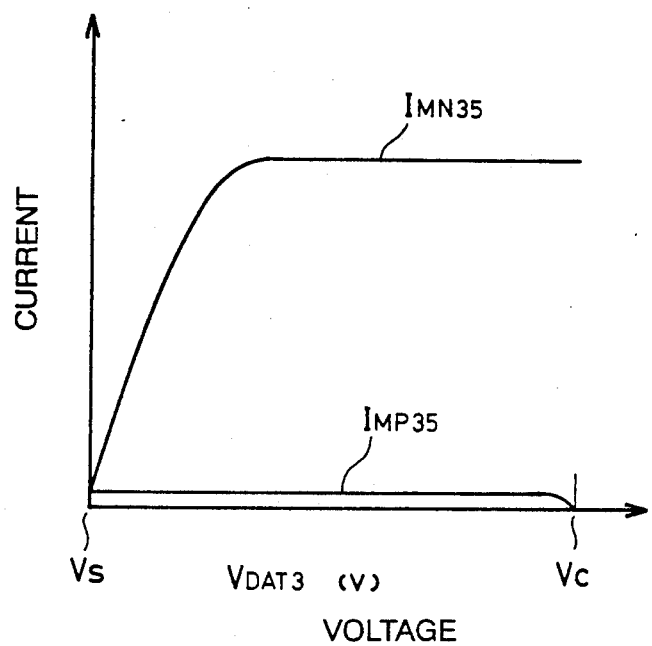
FIGS. 9A and 9B are graphs showing the voltage-current characteristic curves in the second embodiment shown in FIG. 8.

Next, the operation of the above second embodiment will be explained with reference to the voltage-current characteristic curves shown in FIGS. 9A and 9B.

In the case where the selected memory cell is in the non-written state, the N-channel MOSFET MN31 becomes conductive in the same manner as the conventional circuit, and the level at the common junction node 31 of the gate and the drain of the P-channel MOSFET MP31 and the gate of the P-channel MOSFET MP32 becomes low. With the low level at the gate of the P-channel MOSFET MP32, the P-channel MOSFET MP32 becomes conductive and, accordingly, the high level output $V_{SA3}$ is outputted from the sense circuit SA3. As the output voltage $V_{SA3}$ of high level is applied to the gate of the N-channel MOSFET MN35 in the comparison amplifier AMP3, this N-channel MOSFET MN35 becomes conductive and the current $I_{MN35}$ shown in FIG. 9A flows therein accordingly.

At this time, as the N-channel MOSFET MN37 also receives at its gate the high level output voltage $V_{SA3}$, this N-channel MOSFET MN37 becomes conductive and it pulls down the output voltage $V_{RA3}$ to the low level. With the low level of the output voltage $V_{RA3}$ of the reference voltage generation circuit RA3, the N-channel MOSFET MN36 becomes a non-conductive state or a high resistance state, so that substantially no current flows therein.

Corresponding to the above, there flows substantially no current in the P-channel MOSFET MP36 which is connected in series with the N-channel MOSFET MN36 and also in the P-channel MOSFET MP35 which constitutes the current-mirror circuit with the P-channel MOSFET MP36. The current which flows in this P-channel MOSFET MP35 is as shown by $I_{MP35}$ in FIG. 9A. The output DAT3 of the comparison amplifier AMP3 at this time becomes approximately the same voltage as the ground potential source Vs, that is the intersection of the currents $I_{MN35}$ and $I_{MP35}$ in FIG. 9A.

On the contrary, in the case where the selected memory cell is in the written state, the N-channel MOSFET MN31 becomes non-conductive in the same manner as the conventional circuit, so that the common junction node 31 is pulled up to high level by the P-channel MOSFET MP31. With the high level of the gate of P-channel MOSFET MP32, the P-channel MOSFET MP32 becomes non-conductive and the sense output $V_{SA3}$ of the sense circuit SA3 is discharged by the N-channel MOSFET MN32, whereby the output voltage $V_{SA3}$ of low level is outputted. As the N-channel MOSFET MN35 receives at its gate the output voltage $V_{SA3}$ of low level, it becomes non-conductive. Thus, there flows substantially no current in the N-channel MOSFET MN35 as shown by the current $I_{MN35}$ in FIG. 9B.

Under the above circumstance, as the N-channel MOSFET MN37 receives at its gate the output voltage $V_{SA3}$ of low level, it becomes non-conductive and the reference voltage $V_{RA3}$ of the reference voltage generation circuit RA3 becomes a high level in the same manner as the output voltage $V_{SA3}$ of the sense circuit SA3 in the case where the memory cell in the non-written state is selected.

In response to the high level reference voltage $V_{RA3}$, the N-channel MOSFET MN36 becomes conductive and, further, the P-channel MOSFET MP36 which is connected in series with the N-channel MOSFET MN36 and the P-channel MOSFET MP35 which constitutes the current-mirror circuit with the P-channel MOSFET MP36 become conductive. The current which flows in the P-channel MOSFET MP35 is as shown by the current $I_{MP35}$ in FIG. 9B.

Figure 9B:
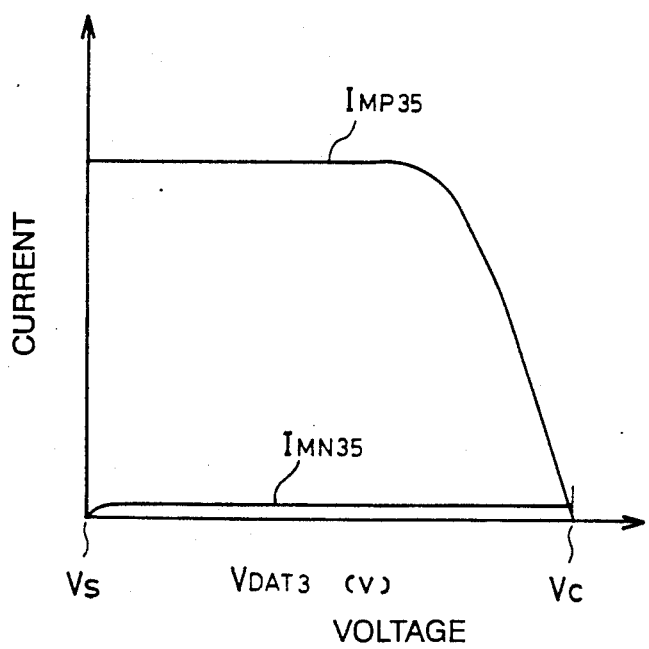

The output DAT3 of the comparison amplifier AMP3 at this time becomes approximately the same voltage as the power supply source Vc, that is the intersection of the currents $I_{MP35}$ and $I_{MN35}$ in FIG. 9B.

In this embodiment, by appropriately setting the ratio of the mutual transfer conductance of the P-channel MOSFETs MP31 and MP32 which constitute the current-mirror circuit, it is possible to adjust the potential difference between the high level output and the low level output of the output voltage $V_{SA3}$ of the sense circuit SA3.

As has been explained hereinabove, in the data read-out circuit of this invention which has the sense circuit to detect the state of the selected memory cell, the reference voltage generation circuit which has the same circuit configuration as that of the sense circuit and which produces the reference voltage, and the comparison amplifier which compares the output voltage from the sense circuit with the reference voltage from the reference voltage generation circuit, the data read-out circuit is characterized by further comprising the reference voltage control means which varies the reference voltage in accordance with the output voltage from the sense circuit. Therefore, the output voltage of the comparison amplifier outputs approximately the same voltage as the power supply voltage Vc or the ground potential voltage Vs, whereby a wider amplitude of the output voltage as compared with the conventional circuit can be obtained and a wider operation margin can be achieved.

Further, as there flows substantially no through-current through the P-channel MOSFET and the N-channel MOSFET which are connected to the output terminal of the comparison amplifier, from the power supply source Vc to the ground potential source Vs, a reduction in the power consumption can be also achieved.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device comprising:
a power supply node and a ground potential node;
a plurality of memory cells arranged in a matrix form;
an address means for selecting one particular memory cell among said plurality of memory cells which is designated by an address information;
a sense circuit for outputting a sense output voltage of one of a first and a second level corresponding to a logic level of data which has been read-out from said particular memory cell selected by said address means;
a reference voltage generation circuit for producing a reference voltage;
a comparison amplifier of a current-mirror type which compares said sense output voltage from said sense circuit with said reference voltage from said reference voltage generation circuit, and outputs a data output; and
a reference voltage control means for varying said reference voltage from said reference voltage generation circuit in accordance with the changes in said sense output voltage from said sense circuit, said reference voltage being pulled to a predetermined level when said sense output voltage from said sense circuit is at said second level.

2. A semiconductor memory device comprising:
a power supply node and a ground potential node;
a plurality of memory cells arranged in a matrix form;
an address means for selecting one particular memory cell among said plurality of memory cells which is designated by an address information;
a sense circuit for outputting a sense output voltage corresponding to a logic level of data which has been read-out from said particular memory cell selected by said address means;
a reference voltage generation circuit for producing a reference voltage;
a comparison amplifier of a current-mirror type which compares said sense output voltage from said sense circuit with said reference voltage from said reference voltage generation circuit; and
a reference voltage control means for varying said reference voltage from said reference voltage generation circuit in accordance with the changes in said sense output voltage from said sense circuit;
wherein said sense circuit includes a first input node, a first output node, a first transistor, a first inverter and a first load transistor, said first transistor being connected between said first input node to which the read-out data is supplied and said first output node, said first inverter producing an inverted data of the read-out data and controlling said first transistor, and said first load transistor being connected between said power supply node and said first output node;
said reference voltage generation circuit includes a second input node, a second output node, a second transistor, a second inverter and a second load transistor, said second transistor being connected between said second input node to which a reference output data of a reference memory cell is supplied and said second output node, said second inverter producing an inverted data of said reference output data and controlling said second transistor, and said second load transistor being connected between said power supply node and said second output node; and
said reference voltage control means includes a third transistor connected between said power supply node and said second output node of said reference voltage generation circuit, said third transistor being controlled by said sense output voltage from said sense circuit.

3. A semiconductor memory device according to claim 2, in which said first and second transistors are N-channel MOS field effect transistors, and said first and second load transistors and a third transistor are P-channel MOS field effect transistors.

4. A semiconductor memory device comprising:
a power supply node and a ground potential node;
a plurality of memory cells arranged in a matrix form;
an address means for selecting one particular memory cell among said plurality of memory cells which is designated by an address information;
a sense circuit for outputting a sense output voltage corresponding to a logic level od data which has been read-out from said particular memory cell selected by said address means;
a reference voltage generation circuit for producing a reference voltage;
a comparison amplifier of a current-mirror type which compares said sense output voltage from said sense circuit with said reference voltage from said reference voltage generation circuit; and
a reference voltage control means for varying said reference voltage from said reference voltage generation circuit in accordance with the changes in said sense output voltage from said sense circuit:
wherein said sense circuit includes first input node, a first output node, a first and a second transistor, a first inverter and a first and a second load transistor, said first transistor having a source connected to said first input node, said first inverter having an input terminal connected to said first input node and an output terminal connected to a gate of said first transistor, said first load transistor having a source connected to said power supply source, a gate and a drain tied together and further connected to a drain of said first transistor, said second transistor having a source connected to said ground potential node and a gate and a drain tied together and further connected to said first output node, said first load transistor having a source connected to said power supply node, a gate connected commonly to the gate and the drain of said first loan transistor, and said first and second load transistors forming a current-mirror circuit;
said reference voltage generation circuit includes a second input node, a second output node, a third and a fourth transistor, a second inverter, and a third and a fourth load transistor, said third transistor having a source connected to said second input node, said second inverter having an input terminal connected to said second input node and an output terminal connected to a gate of said third transistor, said third load transistor having a source connected to said power supply source, a gate and a drain tied together and further connected to a drain of said third transistor, said fourth connected to a drain of said third transistor, said fourth transistor having a source connected to said ground potential node and a gate and a drain tied together and further connected to said second output node, said fourth load transistor having a source connected to said power supply node, a gate connected commonly to the gate and the drain of said third load transistor, and said third and fourth load transistors forming a current-mirror circuit; and said reference voltage control circuit includes a fifth transistor connected between said second output node and said ground potential node, said fifth transistor being controlled by said sense output voltage from said sense circuit.

5. A semiconductor memory device according to claim 4, in which said first to fifth transistors are N-channel MOS field effect transistors, and said first to fourth load transistors are P-channel MOS field effect transistors.

6. A semiconductor memory device according to claim 1, wherein said predetermined level is a high level substantially equal to a potential supplied to said power supply node.

7. A semiconductor memory device according to claim 4, wherein said predetermined level is a low level substantially equal to a potential supplied to said ground potential node.

* * * * *